United States Patent [19]

Kataoka et al.

[11] Patent Number: 4,554,237
[45] Date of Patent: Nov. 19, 1985

[54] PHOTOSENSITIVE RESIN COMPOSITION AND METHOD FOR FORMING FINE PATTERNS WITH SAID COMPOSITION

[75] Inventors: Fumio Kataoka; Fusaji Shoji, both of Yokohama; Hitoshi Yokono, Katsuta; Daisuke Makino, Mito; Shigeru Koibuchi; Asao Isobe, both of Hitachi, all of Japan

[73] Assignees: Hitach, Ltd.; Hitachi Chemical Company, Ltd., both of Tokyo, Japan

[21] Appl. No.: 452,198

[22] Filed: Dec. 22, 1982

[30] Foreign Application Priority Data

Dec. 25, 1981 [JP] Japan ................................. 56-209424
Dec. 25, 1981 [JP] Japan ................................. 56-209425

[51] Int. Cl.$^4$ .......................... G03C 1/52; G03C 1/60; G03C 5/16
[52] U.S. Cl. .................................. 430/197; 430/194; 430/927; 430/325; 430/331; 260/349
[58] Field of Search ............... 430/197, 194, 927, 325, 430/331; 260/349

[56] References Cited

U.S. PATENT DOCUMENTS

| | | | |
|---|---|---|---|
| 3,539,559 | 11/1970 | Ruckert | 430/197 |
| 3,856,531 | 12/1974 | Grisdale et al. | 430/194 |
| 3,869,292 | 3/1975 | Peters | 430/197 X |
| 3,968,129 | 7/1976 | Kampe et al. | 260/349 |
| 4,139,390 | 2/1979 | Rauner et al. | 430/197 |
| 4,148,655 | 4/1979 | Itoh et al. | 430/197 |
| 4,177,073 | 12/1979 | Hata et al. | 430/197 |
| 4,451,551 | 5/1984 | Kataoka et al. | 430/197 |

FOREIGN PATENT DOCUMENTS

| | | | |
|---|---|---|---|
| 0030107 | 6/1981 | European Pat. Off. | 430/296 |
| 50-95002 | 7/1975 | Japan | 430/197 |
| 53-34902 | 9/1978 | Japan . | |
| 57-81261 | 5/1982 | Japan | 430/197 |

OTHER PUBLICATIONS

Takao Iwayanagi et al., "Azide-Phenolic Resin Photoresists for Deep UV Lithography", IEEE Transactions on Electron Devices, Nov. 1981, vol. Ed.-28, No. 11, pp. 1306-1310.

Primary Examiner—John E. Kittle
Assistant Examiner—Cynthia Hamilton
Attorney, Agent, or Firm—Antonelli, Terry & Wands

[57] ABSTRACT

Disclosed are photosensitive resin composition useful for formation of fine patterns on semiconductor devices, magnetic bubble devices, etc. which is highly sensitive and is excellent in developability and which has no problem such as precipitation of azide compounds and remaining azide particles after development and a method for forming fine patterns with said composition.

Said photosensitive resin composition comprises (a) at least one polymer compound selected from the group consisting of a novolak resin and a polyhydroxystyrene resin and (b) an azide compound represented by the general formula (1):

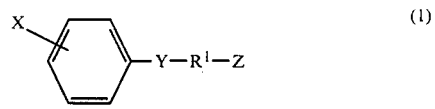

[wherein X is $-N_3$ or $-SO_2N_3$, Y is

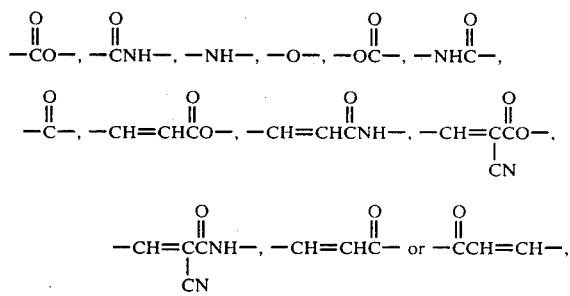

$R^1$ is a lower alkylene such as $-CH_2CH_2-$, $-CH_2CH_2CH_2-$, or $-CH_2CH_2OCH_2CH_2CH_2-$, a hydroxyalkylene or an aminoalkylene such as $$-CH_2CH_2\underset{\underset{CH_3}{|}}{N}CH_2CH_2-, \text{ Z is } -R^2, -OR^3, -N\begin{matrix}R^4\\\\R^5\end{matrix},$$

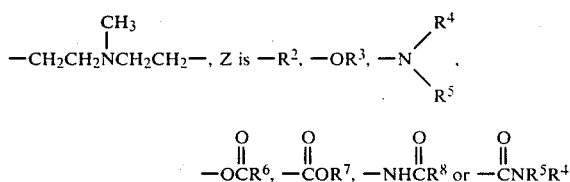

(wherein $R^4$ and $R^5$ are lower alkyl or hydrogen, $R^6-R^8$ are lower alkyl groups, $R^3$ is hydrogen, a lower alkyl group or $-CH_2CH_2O)_nR^9$ wherein n is an integer of 3 or less and $R^9$ is hydrogen or a lower alkyl group)].

17 Claims, No Drawings

PHOTOSENSITIVE RESIN COMPOSITION AND METHOD FOR FORMING FINE PATTERNS WITH SAID COMPOSITION

BACKGROUND OF THE INVENTION

1. Field of the Invention

This invention relates to a photosensitive resin composition used for forming fine patterns in microelectronic devices such as semiconductor devices, magnetic bubble devices, optoelectronic devices and a method for forming fine patterns with said composition.

2. Brief Description of the Prior Art

There is a tendency that semiconductor integrated circuits become higher in their packing densities from year to year. Therefore, their pattern lines become finer and finer. Thus, fine patterns must be formed using high resolution resists.

Fine patterns are produced by (a) X-ray lithography, (b) electron beam lithography or (c) photo lithography.

However, practical X-ray sources have not been developed for X-ray lithography and the electron beam lithography requires a long time for drawing the patterns on resist coated on a substrate.

Photo lithography uses negative type photoresists or positive type photoresists as resists. The negative type photoresists include (a) those which comprise a hydroxystyrene polymer and an aromatic monoazide compound. However, in the case of said photoresists (a) the azide compound used is a solid of high crystallinity and this is precipitated from solution or precipitated from coating film when the resists are made into a coating film. Furthermore, the crystals remain as fine particles in unexposed portions which are to be dissolved upon development with an alkaline aqueous solution and the remaining crystals cause closing up of patterns or disruption of patterns.

Other representative negative type photoresists are compositions comprising combinations of cyclized rubbers and aromatic azide compounds. As the aromatic azide compounds, there have been used azidobenzal ketones such as 2,6-bis(4'-azidobenzal)-4-methylcyclohexanone and 2,6-bis(4'-azidobenzal)cyclohexanone.

The maximum absorption wavelength region of these negative type photoresistors is 360 nm corresponding to the aromatic azide compounds used and since in this region there occur conspicuous interference and diffraction of light, resolution of photoresists is limited to 1.5 μm. If materials sensitive in shorter wavelength region are found, the resolution of photoresists is increased. Furthermore, in the case of said negative type photoresists comprising cyclized rubbers and aromatic azide compounds, developing solution which dissolve uncured portions swell the cured resist at the time of development after curing with UV rays and thus cause expansion or winding of the resist. It is considered that the swelling of the resist per se in addition to the interference and diffraction of light is a big factor for reduction of resolution.

On the other hand, representatives of positive type photoresists are those which comprise combinations of novolak resins and quinonediazide compounds and o-naphthoquinonediazide and some modified ones of these are used as photosensitive materials.

Positive type photoresists are generally superior in resolution and this is considered because the base resin used is an organic substance such as novolak resin while the developing solution is an alkaline aqueous solution and therefore the resin portion does not swell at the time of development and only the portion exposed to UV rays is dissolved. However, the conventional positive type photoresists have the defects that the maximum absorption wavelength region thereof is 340-450 nm like that of negative type photoresists for obtaining high sensitivity and so they are liable to show reduction in resolution due to interference or diffraction of light.

SUMMARY OF THE INVENTION

The first object of this invention is to provide a photosensitive resin composition having high resolution, namely, having the maximum absorption wavelength of 330 nm or less and having high sensitivity and a method for forming fine patterns with this photosensitive resin composition. The second object of this invention is to provide a photosensitive resin composition having higher resolution, namely, having the maximum absorption region of 290 nm or less and having high sensitivity and a method for forming fine patterns with this photosensitive resin composition. The third object of this invention is to provide a liquid photosensitive resin composition which has the highest resolution, namely, the maximum absorption wavelength region of 290-200 nm and high sensitivity and which causes no precipitation of azide compounds from a resist solution and provide no remaining azide fine particles upon development to remove unexposed portions and a method for forming fine patterns with this photosensitive resin composition.

The first object has been attained by a photosensitive resin composition which comprises (a) at least one polymer compound selected from the group consisting of a novolak resin and a polyhydroxystyrene resin and (b) an azide compound represented by the general formula (1):

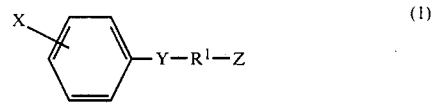

wherein X is —N₃ or —SO₂N₃, Y is

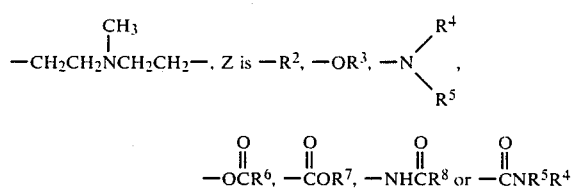

R¹ is a lower alkylene such as —CH₂CH₂—, —CH₂CH₂CH₂—, or —CH₂CH₂OCH₂CH₂CH₂—, a hydroxyalkylene or an aminoalkylene such as

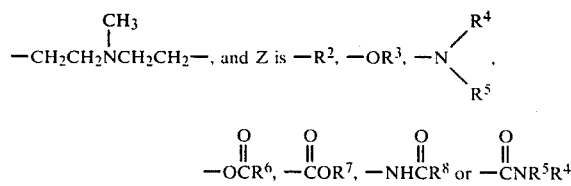

(wherein R² R⁶—R⁸ are lower alkyl groups, R⁴ and R⁵ are lower alkyl or hydrogen, R³ is hydrogen, a lower alkyl group or ─(CH₂CH₂O)ₙ─R⁹ wherein n is an integer of 3 or less and R⁹ is hydrogen or a lower alkyl group), for example, —OH, —NH₂, —N(CH₃)₂, —N(C₂H₅)₂, —N(C₃H₇)₂, etc. and by coating a negative type photoresist comprising this photosensitive resin composition and an organic solvent, drying this coat, locally exposing the resultant film and then developing the film with an alkaline aqueous solution to dissolve and remove unexposed portions.

The second object has been attained by a photosensitive resin composition which comprises (a) at least one polymer compound selected from the group consisting of a novolak resin and a polyhydroxystyrene resin and (b) an azide compound represented by the general formula (1):

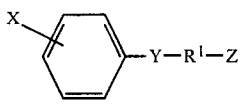

wherein X is —N₃ or —SO₂N₃, Y is

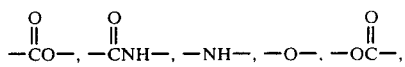

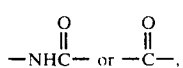

R¹ is a lower alkylene such as —CH₂CH₂—, —CH₂CH₂CH₂—, or —CH₂CH₂OCH₂CH₂CH₂—, a hydroxyalkylene or an aminoalkylene such as

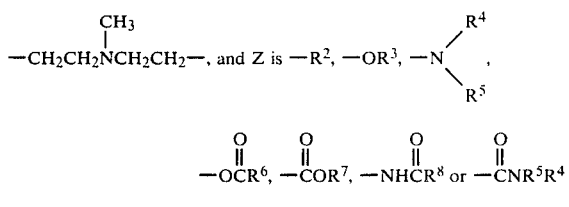

(wherein R² R⁶-R⁸ are lower alkyl groups, R⁴ and R⁵ are lower alkyl group or hydrogen, R³ is hydrogen, a lower alkyl group or ─(CH₂CH₂O)ₙ─R⁹ wherein n is an integer of 3 or less and R⁹ is hydrogen or a lower alkyl group), for example, —OH, —NH₂, —N(CH₃)₂, —N(C₂H₅)₂, ─N(C₃H₇)₂, etc. and by coating a negative type photoresist comprising this photosensitive resin composition and an organic solvent, drying the coat, locally exposing the resultant film and then developing it with an alkaline aqueous solution to dissolve and remove unexposed portions.

The third object has been attained by a liquid photosensitive resin composition which comprises (a) at least one polymer compound selected from the group consisting of a novolak resin and a polyhydroxystyrene resin and (b) an azide compound represented by the general formula (1):

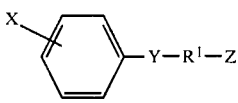

wherein X is —N₃, Y is

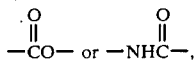

R¹ is —CH₂CH₂—, —CH₂CH₂CH₂—, —CH₂CH₂OCH₂CH₂CH₂— or

and Z is —OH, —NH₂, —N(CH₃)₂, —N(C₂H₅)₂ or —N(C₃H₇)₂ and by coating a negative type photoresist comprising this photosensitive resin composition and an organic solvent, drying the coat, locally exposing the resultant film and then developing it with an alkaline aqueous solution to dissolve and remove unexposed portions.

The outline of this invention will be explained hereinbelow. Use of said compound (a) as a high molecular compound results in no expansion of the unexposed portions upon development with an alkaline aqueous solution.

The novolak resins (condensates of formaldehyde and phenol, cresol and other alkyl phenols) include homocondensates or cocondensates such as phenol novolak resin, cresol novolak resin, phenol cresol novolak resin, etc. These resins may be used alone or as mixtures of two or more. The molecular weight of the novolak resins and polyhydroxystyrene resins is at least 500, preferably 1,000 to 500,000, more preferably 1,000 to 100,000 in terms of number average molecular weight. When it is less than 500, film-forming ability lowers. When more than 1,000, the film-forming ability at 10° to 100° C. is good and besides the heat resistance is also good.

The aromatic azide compounds and aromatic sulfonylazide compounds (b) represented by the general formula (1) are used for preventing precipitation of azide compounds from resist solution, preventing this compound from remaining after development and providing high resolution and high sensitivity. That is, active nitrene produced from the light-excited compounds represented by the general formula (1) react with said polymer compounds (a) to result in insolubilization of the exposed portions which are not dissolved even by development with an alkaline aqueous solution.

The compounds represented by the general formula (1) have one group represented by Y besides benzene ring as constitution units which form one chromophore by conjugation with, for example, an aromatic azide group and Y. When Y is carbonyl group, amide group, amino group, ether group, or ester group, conjugation effect is not so great and the maximum absorption wavelength is in the relatively short wavelength region (less than 330 nm) and hence resolution characteristics are improved because of the smaller deflection effect of UV ray.

For example, para-azidophenyl 2-(N,N-dimethylamino)ethyl ketone which has a carbonyl group as Y has 287 nm (molar absorption coefficient 16,000), 2-(N,N-dimethylamino)ethyl para-azidobenzoate having an ester group as Y has 274 nm (molar absorption coefficient 16,000), N,N-dimethyl-N'-para-azidobenzoylethylenediamine having an amide group as Y has 270 nm (molar absorption coefficient 17,000) and 2-(N,N-dimethylamino)ethyl meta-azidobenzoate having an ester group as Y and azide group at meta position has 253 nm (molar absorption coefficient 18,000).

Sensitivity of these photosensitive agents is considered to depend on the efficiency of photoreactivity of the azide group and the efficiency of reactivity between active nitrene which is produced from the photodecomposition reaction of the azide and the resin component. One of controlling factors for the efficiency of reactivity between the active nitrene and the resin component is a distance between reaction sites (the closer the reaction sites are, the higher the efficiency is) and this is considered to correlate with compatibility between molecules. Nagamatsu et al also refer to this matter in an article relating to sensitizing efficiency of sensitizers (See Nagamatsu and Inui "Photosensitive High Polymer" page 172 1977 published from Kodansha K.K.). Therefore, high-sensitization has been aimed at by increasing compatibility of resin component and aromatic azide compound. In addition to the polar substituent represented by Y, a hydroxyl group or amino group which is a polar group is introduced into the aromatic azide compound used in this invention at the terminal of its molecule for increasing compatibility of the azide compound with polar novolak resins and polyhydroxystyrene resins. Thus, coating films prepared therefrom are uniform and have a practically acceptable high sensitivity.

As examples of aromatic azide compounds or aromatic sulfonylazide compounds used in the photosensitive resin compositions of this invention, mention may be made of azide group substituted benzoic acid esters having terminal amino group such as 2-(N,N-dimethylamino)ethyl para-(or meta-)azidobenzoate, 3-(N,N-dimethylamino)propyl para-(or meta-)azidobenzoate, etc., azide group substituted benzoic acid esters having terminal hydroxyl group such as 2-hydroxyethyl para-(or meta-)azidobenzoate etc., 2-(N,N-dimethylamino)ethyl para-azidocyanocinnamate, azide group substituted benzamides such as N,N-dimethyl-N'-para-(or meta-)azidobenzoylethylenediamine, N,N-dimethyl-N'-para-(or meta-)azidobenzoylpropylenediamine, etc., azide group substituted aromatic ketones such as para-(or meta-)azidophenyl 2-(N,N-dimethylamino)ethyl ketone, etc., sulfonyl azide group substituted benzoic acid ester sulfonyl azide compounds such as 2-(N,N-dimethylamino)ethyl para-(or meta-)sulfonylazidobenzoate, etc.

The above enumerated aromatic azide compounds and aromatic sulfonylazide compounds may be prepared by, e.g., the following processes.

Azide or sulfonyl group substituted benzoic acid esters having amino group at molecular terminal can be obtained by reacting the corresponding azido or sulfonylazidobenzoyl chloride with an N,N-dialkylaminoalkyl alcohol to produce a hydrochloride of the objective compound and then treating the hydrochloride with an alkali such as sodium hydroxide.

Azide group substituted benzoic acid ester having hydroxyl group at molecular terminal can be obtained by reacting the corresponding azidobenzoyl chloride with a large excess amount of an alkylene diol in the presence of an organic base such as pyridine, triethylamine, etc.

Azide group substituted benzamides can be obtained by reacting the corresponding azidobenzoyl chloride with an N,N-dialkylalkylenediamine to produce a hydrochloride of the objective compound and then treating the hydrochloride with an alkali. Para-(or meta-)azidophenyl 2-(N,N-dimethylamino)ethyl ketone can be prepared from azidoacetophenone by the Mannich reaction using paraformaldehyde and dimethylamine hydrochloride.

Mixing ratio of the polymer compound and the aromatic azide compound in the photosensitive resin composition of this invention is preferably within the range of from 0.5 parts by weight to 150 parts by weight, more preferrably from 2 parts by weight to 100 parts by weight of the aromatic azide compound per 100 parts by weight of the polymer compound. When less than said range, in many cases, practically sufficient photosensitivity cannot be obtained and when more than said range, in many cases, film-forming ability is markedly decreased.

The photosensitive resin composition of this invention is coated on a surface of a suitable substrate as a solution thereof in a suitable organic solvent. The solvent is required to dissolve all of the components of the photosensitive resin composition. For this purpose, there may be used ketones such as acetone, methyl ethyl ketone, cyclohexanone, etc., cellosolves such as methyl cellosolve, ethyl cellosolve, ethyl cellosolve acetate, etc., esters such as ethyl acetate, butyl acetate, etc. and the like. These may be used alone or as a mixture of two or more. The amount of the solvent to be added is suitably 100 to 10,000 parts by weight, preferably 200 to 5,000 parts by weight per 100 parts by weight of the resin composition comprising the polymer compound and the compound represented by the general formula (1).

If necessary, other subsidiary components may be contained in the photosensitive resin compositions of this invention in addition to the polymer compound and the aromatic azide or sulfonylazide compound represented by the general formula (1). Examples of these subsidiary components are thermal polymerization inhibitors for providing storage stability, halation inhibitors for preventing halation from the substrate, adhesion increasing agents for increasing adhesion to the substrate, dyes, pigments, fillers, flame retardants, sensitizers, etc.

Method for forming patterns using the photosensitive resin compositions of this invention will be explained below.

Coating of the photosensitive resin composition on a substrate may be carried out by spin-coating with a spinner, dipping, spraying, printing, etc., which may be optionally chosen depending on the purpose. The resultant coating is dried at a suitable temperature (preferably lower than 120° C.) to form a film. The thickness of the coating film can be adjusted by coating methods and solid concentration and viscosity of the solution.

The coating film of the photosensitive resin composition on the substrate is locally exposed to ultraviolet rays through a photomask, etc. and then unexposed portions are dissolved and removed with developing solutions to obtain relief patterns. As methods for exposure to form patterns there can be used both the contact printing and projection printing. Since the photosensitive resin composition of this invention has sensitive region in a short wavelength region of less than 330 nm, it is preferred to use a photomask base material having high transmission for short wavelength light such as quartz and the like and an illumination source having high emission intensity of short wavelength region such as an Xe-Hg lamp.

The photosensitive resin composition of this invention can be developed with alkaline solutions as mentioned hereinbefore. Examples of these alkaline developing solutions are aqueous solutions of tetra-alkylammonium hydroxides such as tetramethylammonium hydroxide and aqueous solutions of inorganic alkalis such as trisodium phosphate, sodium hydroxide, etc., but there is not limitation as long as they are alkaline solutions. The development can be effected by dipping development, spraying development, etc.

This invention will be further explaned by the following examples where "part" means "part by weight".

EXAMPLE 1

10 parts of phenol novolak resin was dissolved in 90 parts of cyclohexanone and then one part of 2-hydroxyethyl para-azidobenzoate was dissolved therein to obtain a solution of a photosensitive resin composition. At this time, the 2-hydroxyethyl para-azidobenzoate was dissolved instantaneously to become a homogeneous solution. Then, this solution was filtered under pressure using a filter having 1 μm pores.

The resultant solution was spin-coated on a silicon wafer by a spinner and then dried at 70° C. for 20 minutes to obtain a coating film of 0.8 μm thick. This coating film was covered and contacted with a quartz photomask having stripe-pattern and was then exposed to ultraviolet rays for 5 seconds from a 500 W Xe-Hg lamp at a distance of 30 cm from the coating film. This coating film was spray developed with a 0.15N aqueous potassium hydroxide solution and then rinsed with water to obtain relief patterns having sharp edge profile. There occurred neither precipitation of crystals nor were there any remaining azide fine particles between patterns which were seen in the case of using crystalline aromatic azide compounds and the patterns were clean. Fine lines and spaces patterns having a minimum width of 1 μm were obtained.

EXAMPLE 2

10 parts of cresol novolak resin and 2 parts of 2-(N,N-dimethylamino)ethyl para-azidobenzoate were dissolved in 120 parts of ethyl cellosolve acetate to obtain a solution of a photosensitive resin composition. This solution was then filtered under pressure with a filter having 0.2 μm pores.

The resultant solution was spin-coated on a silicon wafer by a spinner and dried at 70° C. for 20 minutes to obtain a coating film of 0.9 μm thick. Under the same conditions as in Example 1, said film was exposed to ultraviolet rays for 5 seconds, then developed with 0.1N aqueous sodium hydroxide solution and rinsed with water to obtain relief patterns having sharp edge profiles. Fine lined and spaced patterns having a minimum width of 1 μm were obtained in this Example.

EXAMPLE 3

10 parts of polyparavinylphenol and 3 parts of 2-(N,N-dimethylamino)ethyl meta-azidobenzoate were dissolved in 120 parts of ethyl cellosolve acetate to obtain a solution of a photosensitive resin composition. This solution was filtered under pressure with a filter having 0.2 μm pores.

The resultant solution was spin-coated on an evenly abraded ceramic substrate by a spinner and then dried at 70° C. for 20 minutes to obtain a coating film of 1.0 μm thick. Under the same conditions as in Example 1, said film was exposed to ultraviolet rays for 5 seconds, developed with a 0.2N aqueous solution of tetramethylammonium hydroxide and then rinsed with water to obtain relief patterns having sharp edge profiles. Fine lined and spaced patterns having a minimum width of 1.5 μm were obtained in this Example.

EXAMPLE 4

10 Parts of phenol novolak resin and 3 parts of N,N-dimethyl-N'-para-azidobenzoylethylenediamine were dissolved in 60 parts of methyl cellosolve acetate to obtain a solution of a photosensitive resin composition, which was then filtered under pressure with a filter having 0.2 μm pores.

The resultant solution was spin-coated on a silicon wafer by a spinner to obtain a coating film of 0.8 μm thick. Under the same conditions as in Example 1 this film was exposed to ultraviolet rays for 5 seconds, developed with a 0.2N aqueous solution of tetramethylammonium hydroxide and then rinsed with water to obtain relief patterns having sharp edge profiles. Fine lined and spaced patterns having a minimum width of 1.0 μm were obtained in this Example.

EXAMPLE 5

10 Parts of phenol novolak resin and 5 parts of para-azidophenyl 2-(N,N-dimethylamino)ethyl ketone were dissolved in a mixed solution comprising 60 parts of cyclohexanone and 40 parts of ethyl cellosolve to obtain a solution of a photosensitive resin composition, which was filtered under pressure with a filter having 0.2 μm pores.

The resultant solution was spin-coated on a silicon wafer by a spinner and then dried at 70° C. for 20 minutes to obtain a coating film of 0.9 μm thick. Under the same conditions as in Example 1, this film was exposed to ultraviolet rays for 10 seconds, developed with 0.1N aqueous solution of tetramethylammonium hydroxide and then rinsed with water to obtain relief patterns having sharp edge profiles. Fine lined and spaced patterns having a minimum width of 1 μm were obtained in this Example.

EXAMPLE 6

10 Parts of polyparavinylphenol and 2 parts of 3-(N,N-dimethylamino)propyl para-azidobenzoate were dissolved in 100 parts of ethyl cellosolve acetate to obtain a solution of a photosensitive resin composition, which was then filtered under pressure with a filter having 0.2 μm pores.

The resultant solution was spin-coated on a silicon wafer by a spinner and dried at 70° C. for 20 minutes to obtain a coating film of 0.9 μm thick. Under the same conditions as in Example 1, this coating film was exposed to ultraviolet rays for 5 seconds, developed with 0.2N aqueous solution of tetramethylammonium hydroxide and rinsed with water to obtain relief patterns having sharp edge profiles. Fine repeating patterns having a minimum width of 1 μm were obtained in this Example.

EXAMPLE 7

The composition shown in Example 1 was coated on a sand-grained clean aluminum foil by a spin-coater and dried.

A printing plate obtained under the same exposing and developing conditions as in Example 1 was mounted on a printing cylinder of a lithographic printing machine and printing was carried out with a printing ink and an etching solution to obtain good prints.

Thus, it was found that the composition of this invention could be used as materials for making printing plates.

EXAMPLE 8

10 parts of polyparavinylphenol was dissolved in 120 parts of ethyl cellosolve acetate and then in this solution was dissolved 3 parts of 3-(N,N-dimethylamino)propyl meta-azidobenzoate to obtain a solution of a photosensitive composition. As shown in Example 1, in this case, too, the dissolution of the aromatic azide component occured instantaneously on addition thereof. This solution was then filtered under pressure with a filter having 1 $\mu$m pores.

The resultant solution was spin-coated on a silicon wafer by a spinner and then dried at 70° C. for 20 minutes to obtain a coating film of 0.9 $\mu$m thick. This film was covered and contacted with a stripe-patter quartz photomask and exposed to ultraviolet rays for 5 seconds by a 500 W Xe-Hg lamp at a distance of 30 cm from the film. This film was then spray developed with 0.2N aqueous solution of tetramethylammonium hydroxide and then rinsed with water to obtain relief patterns having sharp edge profiles. The patterns were sufficiently clean as seen in Example 1.

EXAMPLE 9

10 Parts of phenol novolak resin was dissolved in 40 parts of methyl cellosolve acetate and then in the solution was dissolved 3 parts of N,N-dimethyl-N'-para-azidobenzoylethylenediamine to obtain a solution of a photosensitive resin composition. As in Example 1, the dissolution of the aromatic azid component occured instantaneously on addition thereof. Then, this solution was filtered under pressure by a filter having 1 $\mu$m pores.

The resultant solution was spin-coated on a silicon wafer by a spinner and then dried at 70° C. for 20 minutes to obtain a coating film of 0.9$\mu$m thick. This film was covered and contacted with a stripe-pattern quartz photomask and was exposed to ultraviolet rays for 5 seconds by a 500 W Xe-Hg lamp at a distance of 30 cm from the film. This film was then spray-developed with a 0.2N aqueous solution of tetramethylammonium hydroxide and then rinsed with water to obtain relief patterns having sharp edge profiles. The patterns were sufficiently clean as seen in Example 1.

EXAMPLE 10

10 Parts of phenol novolak resin was dissolved in 100 parts of methyl cellosolve acetate and then in this solution was dissolved 3 parts of 2-(N,N-dimethylamino)ethyl para-azidocinnamate to obtain a solution of a photosensitive resin composition. The dissolution of the aromatic azide component occurred instantaneously on addition thereof to become a homogeneous solution. Then, this solution was filtered under pressure by a filter having 1 $\mu$m pores.

The resultant solution was spin-coated on a silicon wafer by a spinner and then dried at 70° C. for 20 minutes to obtain a coating film of 1.0 $\mu$m thick. This coating film was covered and contacted with a stripe-pattern soda glass photomask and exposed to ultraviolet rays for 10 seconds by a 500 W high pressure mercury lamp at a distance of 30 cm from the film. This film was spray-developed with a 0.2N aqueous solution of tetramethylammonium hydroxide and then rinsed with water to obtain relief patterns having sharp edge profiles. The patterns were sufficiently clean as in Example 1.

EXAMPLE 11

10 Parts of phenol novolak resin was dissolved in 100 parts of methyl cellosolve acetate and then in this solution was dissolved 4 parts of N,N-diethylamino-N'-para-azidobenzylideneacetylethylenediamine to obtain a solution of a photosensitive resin composition. The dissolution of aromatic azide component occurred instantaneously on addition thereof to become a homogeneous solution. Then, this solution was filtered under pressure by a filter having 1 $\mu$m pores.

The resultant solution was spin-coated on a silicon wafer by a spinner and then dried at 70° C. for 20 minutes to obtain a coating film of 1.1 $\mu$m thick. This coating film was covered and contacted with a soda glass photomask of stripe-pattern and exposed to ultraviolet rays for 10 seconds by a 500 W high pressure mercury lamp at a distance of 30 cm from the film. Tne film was then developed with a 0.2N aqueous solution of tetramethylammonium hydroxide by dipping method and then rinsed with water to obtain relief patterns having sharp edge profiles, which were sufficiently clean as in Example 1.

EXAMPLE 12

10 Parts of poly-para-vinylphenol resin was dissolved in 100 parts of methyl cellosolve acetate and then in this solution was dissolved 3 parts of 2-(N,N-dimethylamino)ethyl para-azido$\alpha$-cyanocinnamate to prepare a solution of a photosensitive resin composition. The dissolution of the aromatic azide component occurred instantaneously on addition thereof to become a homogeneous solution. Then, this solution was filtered under pressure by a filter having 1 $\mu$m pores.

The resultant solution was spin-coated on a silicon wafer by a spinner and dried at 70° C. for 20 minutes to obtain a coating film of 0.9 $\mu$m thick. This coating film was covered and contacted with a stripe-pattern soda glass photomask and exposed to ultraviolet rays for 15 seconds by a 500 W high pressure mercury lamp at a distance of 30 cm from the film. This film was developed with a 0.2N aqueous solution of tetramethylammonium hydroxide by dipping method and then rinsed with water to obtain relief patterns having sharp edge profiles These patterns were sufficiently clean as those in Example 1.

EXAMPLE 13

10 Parts of poly-para-vinylphenol resin was dissolved in 100 parts of ethyl cellosolve acetate and then in this solution was dissolved 0.5 part of 2-hydroxyethyl para-azidobenzoate to prepare a solution of a photosensitive resin composition. The dissolution of the aromatic azide component occurred instantaneously on addition thereof to become a homogeneous solution. Then, this solution was filtered under pressure by a filter having 1 $\mu$m pores.

The resultant solution was spin-coated on a silicon wafer by a spinner and dried at 70° C. for 20 mintues to obtain a coating film of 0.7 $\mu$m thick. This coating film was covered and contacted with a quartz photomask having stripe-pattern and exposed to ultraviolet rays for 15 seconds by a 500 W high pressure mercury lamp at a distance of 30 cm from the film. This film was spray developed with a 0.2N aqueous solution of tetramethylammonium hydroxide and then washed with water to obtain relief patterns having sharp edge profiles. These patterns were sufficiently clean as those in Example 1.

COMPARATIVE EXAMPLE

Resolution of a negative-type photoresist (OMR-83 manufactured by Tokyo Oka Kogyo K.K, base resin: cyclized polyisoprene rubber and photosensitive agent: aromatic bisazide compound) was evaluated and the results are shown below as a comparative example.

The above-mentioned photoresist solution was spin-coated on a silicon wafer by a spinner and then dried at 90° C. for 30 minutes to obtain a coating film of 0.8 μm thick. This coating film was covered and contacted with the same photomask as used in Examples 1 to 6 and was exposed to ultraviolet rays for 3 seconds by a 500 W high pressure mercury lamp at a distance of 30 cm from the film. This was developed with a mixed liquid composed of 3 parts by volume of xylene and 7 parts by volume of n-heptane and then was rinsed with n-butyl acetate to obtain relief patterns. In this experiment, the resolution width of the obtained fine repeating patterns was merely 2 μm in minimum.

In the case of line patterns less than 2 μm in width, the patterns reproduced from the straight line patterns of the photomask revealed winding line patterns. Thus, the patterns of the photomask were not accurately transferred.

What is claimed is:

1. A photosensitive resin composition which has a maximum absorption region of 290 nm or less and which comprises (a) at least one polymer compound selected from the group consisting of a novolak resin and a polyhydroxystyrene resin and (b) an azide compound represented by the general formula (1):

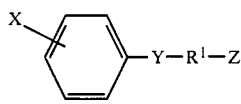

wherein X is —N$_3$ or —SO$_2$N$_3$, Y is

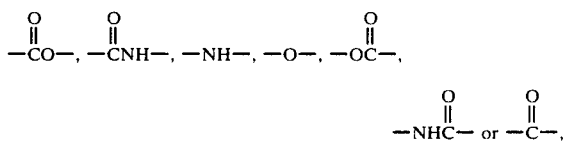

R$^1$ is a lower alkylene, a hydroxyalkylene or an aminoalkylene and Z is —R$^2$, —OR$^3$,

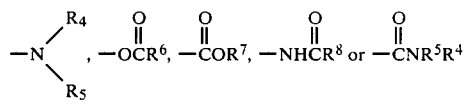

(wherein R$^2$ and R$^6$–R$^8$ are lower alkyl groups, R$^4$ and R$^5$ are lower alkyl or hydrogen, R$^3$ is hydrogen, a lower alkyl group or —CH$_2$CH$_2$O)$_n$R$^9$ wherein n is an integer of 3 or less and R$^9$ is hydrogen or a lower alkyl group) and wherein the amount of the azide compound represented by the general formula (1) is 0.5 to 150 parts by weight per 100 parts by weight of the polymer compound.

2. A liquid photosensitive resin composition which comprises (a) at least one polymer compound selected from the group consisting of a novolak resin and a polyhydroxystyrene resin and (b) an azide compound represented by the general formula (1):

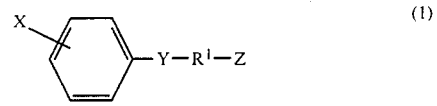

wherein X is —N$_3$, Y is

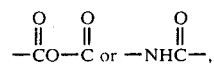

R$^1$ is —CH$_2$CH$_2$—, —CH$_2$CH$_2$CH$_2$—, —CH$_2$CH$_2$OCH$_2$CH$_2$CH$_2$— or

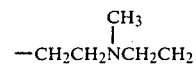

and Z is —OH, —NH$_2$, —N(CH$_3$)$_2$, —N(C$_2$H$_5$)$_2$ or —N(C$_3$H$_7$)$_2$ wherein the amount of the azide compound represented by the general formula (1) is 0.5 to 150 parts by weight per 100 parts by weight of the polymer compound.

3. A photosensitive resin composition according to claim 1, to which a solvent is added.

4. A photosensitive resin composition according to claim 2, to which a solvent is added.

5. A photosensitive resin composition according to claim 1, wherein the compound represented by the general formula (1) is at least one selected from 2-(N,N-dimethylamino)ethyl para-azidobenzoate, 2-(N,N-dimethylamino)ethyl meta-azidobenzoate, 3-(N,N-dimethylamino)propyl para-azidobenzoate, 3-(N,N-dimethylamino)propyl meta-azidobenzoate, 2-hydroxyethyl para-azidobenzoate, 2-hydroxyethyl meta-azidobenzoate, N,N-dimethyl-N'-para-azidobenzoylethylene diamine, N,N-dimethyl-N'-meta-azidobenzoylethylene diamine, N,N-dimethyl-N'-para-azidobenzoylpropylenediamine, N,N-dimethyl-N'-meta-azidobenzoylpropylene-diamine, para-azidophenyl 2-(N,N-dimethylamino)ethyl ketone, meta-azidophenyl 2-(N,N-dimethylamino)ethyl ketone, 2-N,N-dimethylamino)ethyl para-sulfonylazidobenzoate, 2(N,N-dimethylamino)ethyl meta-sulfonylazidobenzoate and para-azidophenyl 2-(N,N-dimethylamino)ethyl para-sulfonylazidobenzoate.

6. A liquid photosensitive resin composition according to claim 2 wherein the compound represented by the general formula (1) is at least one selected from 2-(N,N-dimethylamino)ethyl para-azidobenzoate, 2-(N,N-dimethylamino)ethyl meta-azidobenzoate, 3-(N,N-dimethylamino)propyl para-azidobenzoate, 3-(N,N-dimethylamino)propyl meta-azidobenzoate, 2-hydroxyethyl para-azidobenzoate, 2-hydroxyethyl para-azidobenzoate, 2-hydroxyethyl meta-azidobenzoate, N,N-dimethyl-N'-para-azidobenzoylethylenediamine, N,N-dimethyl-N'-meta-azidobenzoylethylenediamine, N,N-dimethyl-N'-para-azidobenzoylpropylenediamine, N,N-dimethyl-N'-meta-azidobenzoylpropylenediamine, para-azidophenyl 2-(N,N-dimethylamino)ethyl ketone and meta-azidophenyl 2-(N,N-dimethylamino)ethyl ketone.

7. A photosensitive resin composition according to claim 3 wherein the solvent is at least one compound selected from acetone, methyl ethyl ketone, cyclohexanone, methyl cellosolve, ethyl cellosolve, ethyl cellosolve acetate, ethyl acetate and butyl acetate.

8. A photosensitive resin composition according to claim 4 wherein the solvent is at least one compound selected from acetone, methyl ethyl ketone, cyclohexanone, methyl cellosolve, ethyl cellosolve, ethyl cellosolve acetate, ethyl acetate and butyl acetate.

9. A photosensitive resin composition according to claim 3 wherein amount of the solvent is 100 to 10,000 parts by weight per 100 parts by weight of the polymer compound.

10. A photosensitive resin composition according to claim 4 wherein amount of the solvent is 100 to 10,000 parts by weight per 100 parts by weight of the polymer compound.

11. A method for forming fine patterns which comprises coating on a substrate the photosensitive resin composition according to claim 3, drying the coated composition to form a coating film, exposing imagewise this film and developing the film with an alkaline aqueous solution to dissolve and remove the unexposed portions.

12. A method for forming fine patterns which comprises coating on a substrate the photosensitive resin composition according to claim 4, drying the coated composition to form a coating film, exposing imagewise this film and developing the film with an alkaline aqueous solution to dissolve and remove the unexposed portions.

13. A liquid photosensitive resin composition according to claim 2, which has a maximum absorption region of 290 to 200 nm.

14. A photosensitive resin composition which comprises (a) at least one polymer compound selected from the group consisting of a novolak resin and a polyhydroxystyrene resin and (b) at least one azide compound selected from the group consisting of 2-(N,N-dimethylamino)ethyl para-azidobenzoate, 2-(N,N-dimethylamino)ethyl meta-azidobenzoate, 3-(N,N-dimethylamino)propyl para-azidobenzoate, 3-(N,N-dimethylamino)propyl meta-azidobenzoate, 2-hydroxmethyl para-azidobenzoate, 2-hydroxyethyl meta-azidobenzoate N,N-dimethyl-N'-para-azidobenzoylethylenediamine, N,N-dimethyl-N'-meta-azidobenzoylethylene diamine, N,N-dimethyl-N'-para-azidobenzoylpropyenediamine, N,N-dimethyl-N'-meta-azidobenzoylpropylene-diamine, para-azidophenyl 2-(N,N-dimethylamino)ethyl ketone, meta-azidophenyl 2-(N,N-dimethylamino)ethyl ketone, 2-(N,N-dimethylamino)ethyl para-sulfonylazidobenzoate and 2-(N,N-dimethylamino)ethyl meta-sulfonylazidobenzoate.

15. A photosensitive resin composition which comprises (a) at least one polymer compound selected from the group consisting of a novolak resin and a polyhydroxystyrene resin and (b) at least one azide compound selected from the group consisting of 2-(N,N-dimethylamino)ethyl para-azidobenzoate, 2-(N,N-dimethylamino)ethyl meta-azidobenzoate, 3-(N,N-dimethylamino)propyl meta-azidobenzoate, 2-hydroxyethyl para-azidobenzoate, 2-hydroxyethyl meta-azidobenzoate, N,N-dimethyl-N'-para-azidobenzoylethylenediamine, N,N-dimethyl-N'meta-azidobenzoylethylenediamine, N,N-dimethyl-N'-para-azidobenzoylpropylenediamine, N,N-dimethyl-N'-meta-azidobenzoylpropylenediamine, para-azidophenyl 2-(N,N-dimethylamino)ethyl para-sulfonylazidobenzoate and 2-(N,N-dimethylamino)ethyl meta-sulfonylazidobenzoate.

16. A liquid photosensitive resin composition which comprises (a) at least one polymer compound selected from the group consisting of a novolak resin and a polyhydroxystyrene resin and (b) at least one azide compound selected from the group consisting of 2-(N,N-dimethylamino)ethyl para-azidobenzoate, 2-(N,N-dimethylamino)ethyl meta-azidobenzoate, 3-(N,N-dimethylamino)propyl para-azidobenzoate, 3-(N,N-dimethylamino)propyl meta-azidobenzoate, 2-hydroxyethyl para-azidobenzoate, 2-hydroxyethyl meta-azidobenzoate, N,N-dimethyl-N'-para-azidobenzoylethylenediamine, N,N-dimethyl-N'-meta-azidobenzoylethylenediamine, N,N-dimethyl-N'-para-azidobenzoylpropylenediamine, N,N-dimethyl-N'-meta-azidobenzoylpropylenediamine, para-azidophenyl 2-(N,N-dimethylamino)ethyl ketone and meta-azidophenyl 2-(N,N-dimethylamino)ethyl ketone.

17. A photosensitive resin composition which comprises (a) at least one polymer compound selected from the group consisting of a novolak resin and a polyhydroxystyrene resin and (b) an azide compound represented by the general formula (1):

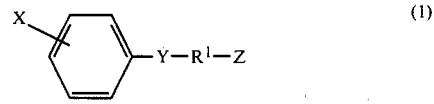

wherein X is $-N_3$, Y is

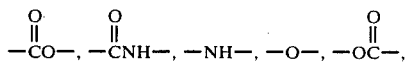

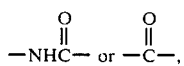

$R^1$ is a lower alkylene, a hydroxyalkylene or an aminoalkylene and Z is $-R^2$, $-OR^3$,

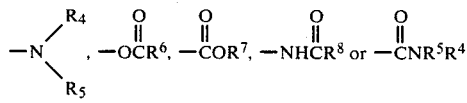

(wherein $R^2$ and $R^6$-$R^8$ are lower alkyl groups, $R^4$ and $R^5$ are lower alkyl or hydrogen, $R^3$ is hydrogen, a lower alkyl group or $-(CH_2CH_2O)_n-R^9$ wherein n is an integer of 3 or less and $R^9$ is hydrogen or a lower alkyl group) and wherein the amount of the azide compound represented by the general formula (1) is 0.5 to 150 parts by weight per 100 parts by weight of the polymer compound.

* * * * *